(12) United States Patent
Brodbeck et al.

(10) Patent No.: US 10,462,910 B2
(45) Date of Patent: Oct. 29, 2019

(54) FITTING ELEMENT FOR FITTING TO A CIRCUIT BOARD

(71) Applicant: Würth Elektronik eiSos GmbH & Co. KG, Waldenburg (DE)

(72) Inventors: Micha Brodbeck, Ammertsweiler (DE); Stefan Klingler, Michelbach (DE); Daniel Kübler, Sulzbach/Murr (DE)

(73) Assignee: Würth Elektronik eiSos GmbH & Co. KG, Waldenberg (DE)

( * ) Notice: Subject to any disclaimer, the term of this patent is extended or adjusted under 35 U.S.C. 154(b) by 299 days.

(21) Appl. No.: 15/109,919

(22) PCT Filed: Nov. 4, 2015

(86) PCT No.: PCT/EP2015/075713
§ 371 (c)(1),
(2) Date: Jul. 6, 2016

(87) PCT Pub. No.: WO2016/075012
PCT Pub. Date: May 19, 2016

(65) Prior Publication Data
US 2016/0330849 A1    Nov. 10, 2016

(30) Foreign Application Priority Data
Nov. 11, 2014    (DE) .......................... 10 2014 222 951

(51) Int. Cl.
*B23P 19/00* (2006.01)
*H05K 3/36* (2006.01)
(Continued)

(52) U.S. Cl.
CPC .............. *H05K 3/368* (2013.01); *F16B 5/065* (2013.01); *F16B 21/082* (2013.01); *H05K 1/14* (2013.01); *H05K 7/142* (2013.01); *F16B 37/0842* (2013.01)

(58) Field of Classification Search
CPC .... F16B 21/082; F16B 37/0842; F16B 5/065; H05K 7/142; H05K 1/14; H05K 3/368
See application file for complete search history.

(56) References Cited

U.S. PATENT DOCUMENTS 4,473,204 A * 9/1984 Bohm ................. H05K 7/142
                                                174/138 D
4,901,204 A    2/1990 Hayashi
(Continued)

FOREIGN PATENT DOCUMENTS

CN        201957331 U    8/2011
CN        202476005 U    10/2012
(Continued)

*Primary Examiner* — Paul D Kim
(74) *Attorney, Agent, or Firm* — McGlew and Tuttle, P.C.

(57) ABSTRACT

A fitting element includes a first fitting section for connection with a spacer element, and a second arresting section for arresting with a circuit board. A central section is arranged between the fitting section and the arresting section and serves for forming a first stop for the spacer element, and a second stop for the circuit board. The fitting element is connected with an associated spacer element for forming a fitting device. The spacer element is fitted to a first circuit board. A second circuit board is then arrested with the fitting element. In this way two circuit boards can be connected with each other in a simple, flexible and automated way.

17 Claims, 5 Drawing Sheets

(51) Int. Cl.
*F16B 5/06* (2006.01)
*H05K 7/14* (2006.01)
*H05K 1/14* (2006.01)
*F16B 21/08* (2006.01)
*F16B 37/08* (2006.01)

(56) References Cited

U.S. PATENT DOCUMENTS

| | | | | |
|---|---|---|---|---|
| 5,191,513 | A * | 3/1993 | Sugiura | H05K 7/142 174/138 D |
| 6,140,591 | A * | 10/2000 | Osborne | H05K 7/142 174/138 E |
| 6,501,030 | B1 * | 12/2002 | Parizi | H01R 12/585 174/250 |
| 8,047,475 | B2 * | 11/2011 | Fukumoto | F16B 2/185 24/297 |
| 8,378,220 | B2 * | 2/2013 | Ochi | B21D 53/20 174/138 D |
| 8,779,295 | B2 * | 7/2014 | Hsieh | H05K 1/0215 174/135 |
| 2005/0217088 | A1 | 10/2005 | Lin | |
| 2006/0164810 | A1 * | 7/2006 | Apfelbacher | H05K 5/0204 361/709 |
| 2010/0178796 | A1 * | 7/2010 | Ishii | H01R 12/585 439/527 |
| 2013/0141852 | A1 | 6/2013 | Chen et al. | |

FOREIGN PATENT DOCUMENTS

| | | |
|---|---|---|
| DE | 19 97 946 U | 12/1968 |
| DE | 34 23 455 A1 | 1/1985 |
| DE | 86 31 156 U1 | 1/1987 |
| DE | 10 2007 035 794 A1 | 2/2009 |
| DE | 20 2012 101 791 U1 | 8/2013 |
| EP | 0 357 362 A2 | 3/1990 |
| EP | 2 254 398 A2 | 11/2010 |
| JP | H11-330733 A | 11/1999 |
| JP | 2003-123871 A | 4/2003 |
| JP | 2008-105464 A | 5/2008 |
| JP | 2011-159938 A | 8/2011 |
| JP | 2012-028624 A | 2/2012 |
| TW | 385133 U | 3/2000 |
| TW | 443704 U | 6/2001 |
| TW | M408220 U1 | 7/2011 |
| WO | 2013171162 A1 | 11/2013 |

* cited by examiner

FITTING ELEMENT FOR FITTING TO A CIRCUIT BOARD

CROSS REFERENCE TO RELATED APPLICATIONS

This application is a United States National Phase Application of International Application PCT/EP2015/075713 filed Nov. 4, 2015 and claims the benefit of priority under 35 U.S.C. § 119 of German Application 10 2014 222 951.0 filed Nov. 11, 2014, the entire contents of which are incorporated herein by reference.

FIELD OF THE INVENTION

The invention concerns a fitting element for fitting to a circuit board. The invention further concerns a fitting device as well as methods for the spaced fitting of circuit boards with such a fitting element.

BACKGROUND OF THE INVENTION

A circuit board assemblage, wherein a first circuit board is connected with a second circuit board in an electrically conductive way by means of spacers, is known from DE 10 2007 035 794 A1. Contact pins are cast into the spacers, which are made of plastic. A bent contact pin is affixed to the first circuit board by means of a soldering agent in an electrically conductive way, whilst a second contact pin is guided through an assembly opening in the second circuit board and soldered there with the aid of a soldering agent. It is of disadvantage that the production of the circuit board compound is complex and in particular that no electrically insulating connection can be produced.

A housing for electronic components is known from EP 0 357 362 A2. A base plate comprising elevated areas for fitting a circuit board is arranged in this housing. Fitting elements that arrest the elevated areas and the circuit board serve for fitting purposes.

SUMMARY OF THE INVENTION

The invention is therefore based on a task of providing a fitting element that will enable simple fitting to a circuit board. The fitting element should in particular enable an electrically insulating connection between circuit boards.

This task is solved by a fitting element for fitting to a circuit board with
a first fitting section for connection with a spacer element,
a second arresting section for arresting with a circuit board, and
a central section, arranged between the fitting section and the arresting section for forming a first stop for the spacer element and a second stop for the circuit board.

The fitting element can be connected with a spacer element, which serves for fitting to a first circuit board, by means of the first fitting section in a simple and automated way. The fitting element can further be arrested with a second circuit board by means of the second arresting section in a simple and automated way, so that the circuit boards are connected with each other in a spaced way. The central section arranged between the fitting section and the arresting section serves for forming a first stop for connecting the first fitting section with the associated spacer element, as well as for forming a second stop for connecting or arresting and/or receiving the second circuit board with or on the second arresting section. The fitting element is in particular made of an elastic material, such as a plastic material, for forming the fitting section and the arresting section.

The assembly area guarantees an automated assembly of the fitting element in a simple way. The fitting element can be held and mounted automatically in the assembly area, arranged at the end side of the second arresting section, in a simple way. The fitting element can for example be automatically connected with the associated spacer element. In addition the fitting element can be automatically held with the spacer element connected to the same, for connecting the spacer element with the first circuit board in a simple and automated way. The assembly area in particular serves as a suction area for pneumatically holding the fitting element.

A fitting element, in which the assembly area is designed flat, and in particular extends vertically to a central longitudinal axis of the fitting element, guarantees a simple automated assembly. The fitting element can be held in a simple way by the assembly area just formed. This can for example be realized pneumatically. The following particularly applies for the assembly area A: $A \geq 3$ mm$^2$, in particular $A \geq 4.5$ mm$^2$, and more particularly $A \geq 6$ mm$^2$. The assembly area is preferably circular. The assembly area preferably extends vertically to a central longitudinal axis of the fitting element. In this way a movement of the fitting element for connecting with the spacer element and/or for fitting the spacer element to a first circuit board in direction of the central longitudinal axis is possible in a simple way.

A fitting element, in which the second arresting section comprises a predetermined deformation point in the region of the assembly area, in particular a predetermined breaking point, enables an arresting of the second arresting section with a second circuit board in a simple way. The fact that the second arresting section comprises a predetermined deformation point, in particular a predetermined breaking point, in the region of the assembly area enables a simple insertion of the second arresting section into an associated recess in the second circuit board. As the assembly area is no longer needed during the arresting of the second arresting section with the second circuit board, a deformation or a breaking of the assembly area is not disadvantageous.

A fitting element, in which the second arresting section comprises at least two arresting arms, arranged at a distance from each other and connected by a wall at their ends, wherein the wall in particular forms a predetermined deformation point, guarantees an arresting of the second arresting section with a second circuit board in a simple way. The fact that the ends of the at least two arresting arms are connected by a wall means that the second arresting section firstly forms an assembly area. Secondly the at least two arresting arms arranged at a distance from each other can be displaced thanks to the predetermined deformation point, in particular the predetermined breaking point, in a simple way radially to a central longitudinal axis of the fitting element. As the arresting arms are flexibly displaceable, an arresting of the second arresting section with a second circuit board is made possible in a simple way. The at least two arresting arms are preferably made from a plastic material.

A fitting element, in which the fitting section is designed as a first arresting section comprising a support pin, arranged concentrically to a central longitudinal axis, on which at least one first arresting projection is formed, guarantees an arresting of the fitting section formed as a first arresting section with a spacer element in a simple way. The at least one first arresting projection extends in a radial direction, starting from the support pin. The at least one arresting projection is for example of a lamellae-, thread- and/or plate-shaped design.

A fitting element, in which several first arresting projections are formed on the support pin along the central longitudinal axis, guarantees a safe fitting of the fitting element on the associated spacer element in a simple way.

A fitting element, in which the fitting section narrows towards a free end, guarantees a simple automated connection of the fitting element with the associated spacer element. The fact that the fitting section narrows at its free end means that the same can be simply and safely inserted into an associated recess in the spacer element.

A fitting element, in which the second arresting section is designed with at least one second arresting projection and narrows in the direction of a free end, starting from the at least one second arresting projection, guarantees a simple automated fitting of a second circuit board to the second arresting section. The fact that the at least one second arresting projection narrows in the direction of one free end means that the second arresting section can be inserted into an associated recess in the second circuit board simply and safely.

A fitting element, in which the fitting section, the arresting section and the central section are made from a plastic material that is resistant up to a temperature of at least 240° C., in particular of at least 260° C., and in particular of at least 280° C., guarantees a simple and automated connection with a first circuit board. A spacer element connected with the fitting element is preferably soldered onto a first circuit board. The spacer element has a high temperature in this way. As the spacer element is in contact with the fitting element, the high temperature will be applied to the fitting element as well. The temperature resistant plastic material prevents a damaging of the fitting element. Temperature resistant means, in particular, that no softening of the plastic material occurs up to a minimum temperature. The fitting element is preferably made from a high temperature plastic material such as for example LCP (LCP: Liquid Crystal Polymer).

A fitting element, in which the fitting section, the arresting section and the central section are made from an electrically insulating plastic material, enables an electrically insulated connection between two circuit boards.

A fitting element, in which the fitting section, the arresting section and the central section are designed together as a single piece, guarantees a reliable fitting in a simple way. The fitting element is also easy to produce. The fitting section and/or the arresting section is/are in particular designed in such a way that the associated connection with the space element or the circuit board is permanent or disconnectable.

The invention is further based on a task of providing a fitting device that enables a spaced connection of circuit boards in a simple, flexible and automated way.

This task is solved by a fitting device for the spaced connection of circuit boards, with
 a spacer element for fitting to a first circuit board,
 a fitting element according to the invention for fitting to a second circuit board, wherein the fitting section is connected with the spacer element.

The advantages of the fitting device according to the invention equal those advantages of the fitting element according to the invention already described. The first fitting section of the fitting element is connected with the spacer element. The connection between the fitting section and the spacer element can be positive-locking, friction-locking and/or firmly bonded. The connection can for example be realized as an arresting connection, a screwed connection, a compound, an adhesive connection and/or an injection molded connection. The fitting section is preferably arranged in a recess of the spacer element and fitted inside the same. The recess is for example designed as a through bore or a dead-end bore. The two-part design of the fitting device enables stipulation of the distance between the circuit boards to be connected in a simple and flexible way by means of the length of the spacer element. For this a specific spacer element can for example be selected from several similar spacer elements of different lengths, depending on the desired distance, and connected with the fitting element. The spacer element is formed separately from the first circuit board, i.e. does not a single piece with the first circuit board. The spacer element is fitted to a first circuit board with the fitting element associated with the same. A second circuit board can then be arrested with the fitting element.

A fitting device, in which the spacer element for soldering to the first circuit board is made from a metal, guarantees a fitting of the spacer element to the first circuit board in a simple and reliable way. The metal is for example steel or brass. The fact that the spacer element consists of a metal means that the fitting device forms an SMD construction element (SMD: Surface Mounted Device), which can for example be soldered onto the first circuit board together with further SMD construction elements.

The invention is further based on a task of providing a method that enables a spaced connecting of circuit boards in a simple, flexible and automated way.

This task is solved by a method for the spaced connection of circuit boards, with the following steps:
 provision of a first circuit board and a second circuit board to be connected with the same,
 provision of several spacer elements and associated fitting elements according to the invention, which are connected with each other,
 fitting the spacer elements to a first circuit board, in particular through soldering the spacer elements to the first circuit board, and
 arranging the second circuit board on the fitting elements, in particular in such a way that the second arresting sections are arrested with the second circuit board.

The advantages of the method according to the invention equal the advantages of the fitting element according to the invention already described as well as those of the fitting device according to the invention. The relevant fitting element can be connected with the associated spacer element before or after fitting or soldering the spacer element onto the first circuit board. The relevant fitting element is preferably first connected with a fitting device together with an associated spacer element, and the spacer element is then fitted or soldered onto to the first circuit board. The method according to the invention can in particular also be developed further with the fitting device according to the invention.

The present invention is described in detail below with reference to the attached figures. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
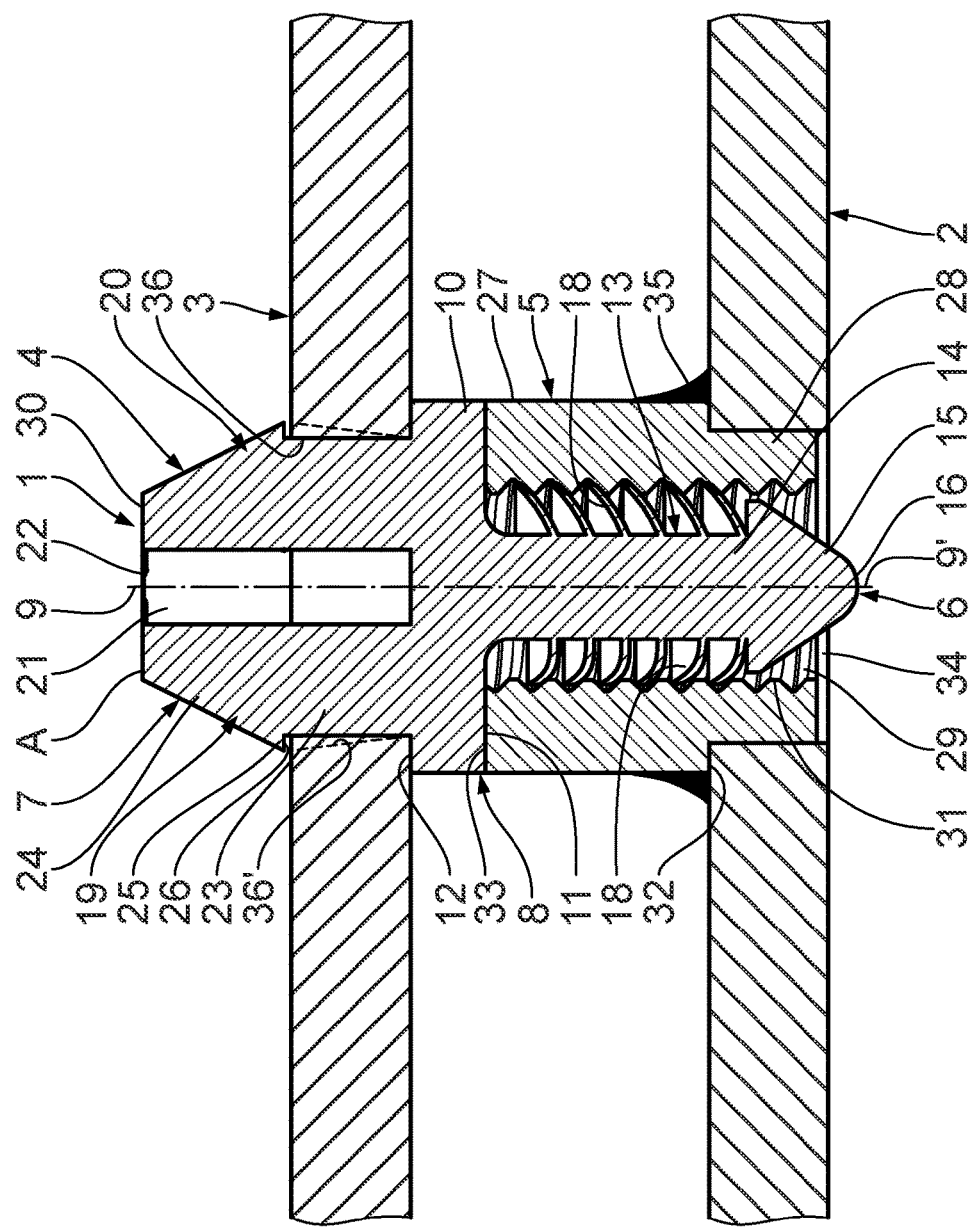
FIG. 1 is a cross-sectional view through a fitting device according to a first embodiment example, connecting two circuit boards with each other in a spaced way.
Figure 2:
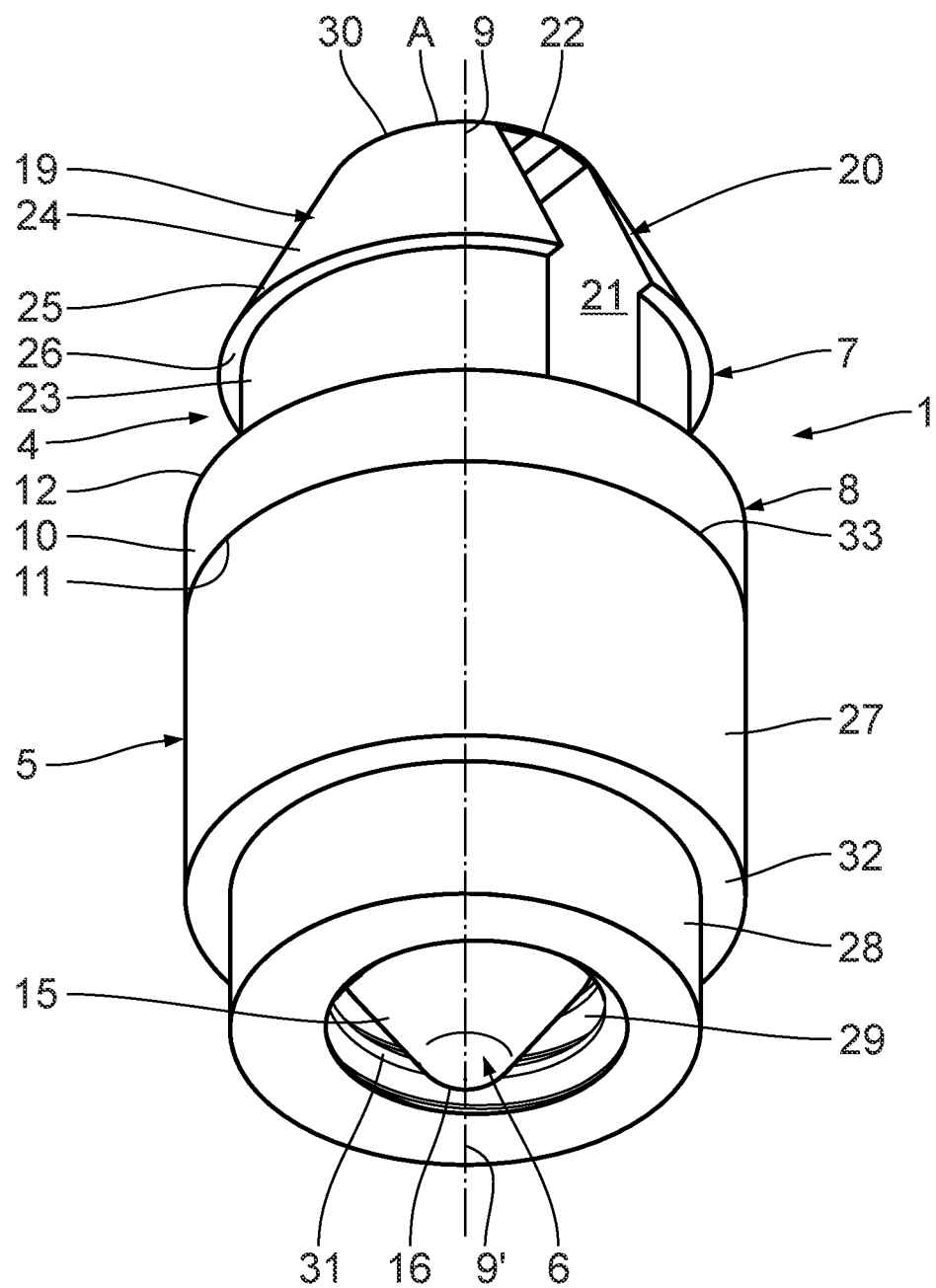
FIG. 2 is a perspective view of the fitting device of FIG. 1.
Figure 4:
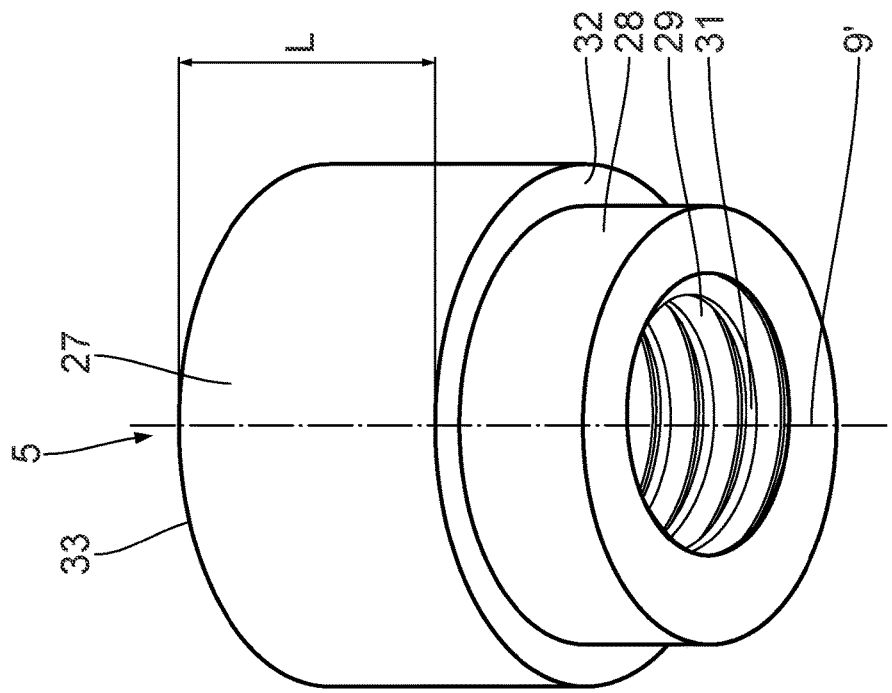
FIG. 4 is a perspective view of a spacer element of the fitting device of FIG. 2.
Figure 3:
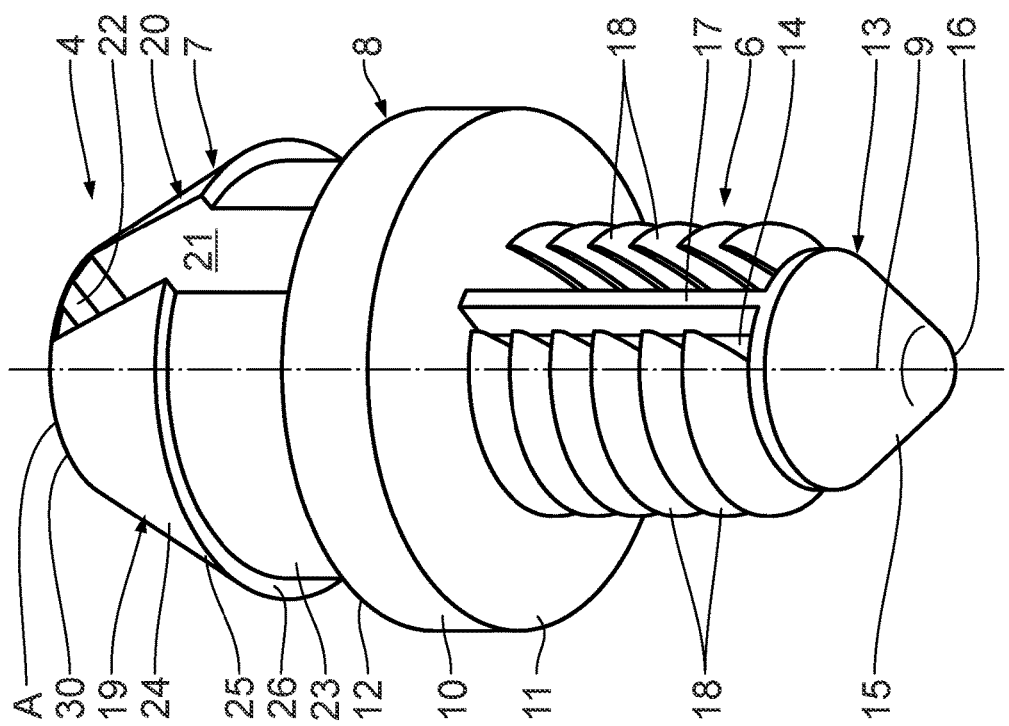
FIG. 3 is a perspective view of a fitting element of the fitting device of FIG. 2.

A first embodiment example is described hereafter with reference to FIGS. 1 to 4. A fitting device 1 serves for the spaced connecting of a first circuit board 2 with a second circuit board 3. The fitting device 1 comprises a fitting element 4, which is connected with an associated spacer element 5 in a positive-locked way.

The fitting element 4 comprises a fitting section designed as a first arresting section 6 and a second arresting section 7, between which a central section 8 is arranged. The arresting sections 6, 7 are formed as a single piece with the central section 8. The arresting sections 6, 7 are further arranged on the central section 8 in such a way that the fitting element 4 comprises a central longitudinal axis 9.

The arresting sections 6, 7 and the central section 8 are made from a plastic material that is resistant up to a temperature of at least 240° C., in particular of at least 260° C., and in particular of at least 280° C. The plastic material is electrically insulating. The plastic material is for example an LCP plastic (LCP: Liquid Crystal Polymer).

The central section 8 is formed by a circular disc 10, which forms a first stop 11 for the spacer element 5 on a front side facing the first arresting section 6, and a second stop 12 on a front side facing the second arresting section 7 for the second circuit board 3. The central section 8 extends substantially vertically to the central longitudinal axis 9.

A support pin 13 extends concentrically to the central longitudinal axis 9, starting from the central section 8. The support pin 13 comprises a cylinder-shaped support pin base body 14, on the end side of which a support pin 15 is arranged, so that the support pin 13 narrows in the direction of a free end 16. Support pin bridges 17 opposing each other relative to the central longitudinal axis 9 are arranged on the support pin base body 14 and extend along the central longitudinal axis 9 and connect the support pin tip 15 with the central section 8. Several first arresting projections 18 are arranged between the support pin bridges 17 on both sides of the support pin base body 14, arranged along the central longitudinal axis 9 at distances from each other. The first arresting projections 18 are of a lamellae- or plate-shaped design. Alternatively the first arresting projections 18 can be of a thread-shaped design. The first arresting projections 18 extend substantially along the half circumference of the support pin base body 14. The support pin 13 and the associated first arresting projections 18 form the first arresting section 6.

The second arresting section 7 extends concentrically to the central longitudinal axis 9, starting from the central section 8. The second arresting section 7 comprises two arresting arms 19, 20, arranged at distances from each other on the central section 8 and delimiting a slot-shaped free space 21 between them. The spaced arrangement allows the ends of the arresting arms 19, 20 to be flexibly displaced in a radial direction. The ends of the arresting arms 19, 20 are connected via a wall 22 delimiting the free space 21. The wall 22 is sufficiently thin to be able to form a predetermined deformation point, which permits a displacement of the arresting arms 19, 20 in a radial direction. The wall 22 is preferably so thin that it forms a predetermined breaking point, so that the wall 22 is destroyed during a radial displacement of the arresting arms 19, 20.

The arresting arms 19, 20 are just formed at one free end 30 of the second arresting section 7. The fact that the wall 22 extends flush between the arresting arms 19, 20 means that the end of the second arresting section 7 forms a flat assembly area A. The assembly area A extends substantially vertically to the central longitudinal axis 9. The assembly area A is in particular of a circular design. It preferably applies: $A \geq 3$ mm$^3$, in particular $A \geq 4.5$ mm$^2$, and in particular $A \geq 6$ mm$^2$ The predetermined deformation point or predetermined breaking point is therefore formed in the region of assembly area A.

The arresting arms 19, 20 each comprise an arresting arm base body 23 and an arresting arm tip 24 arranged on the same. The cross-sections of the relevant arresting arm base body 23 and the associated arresting arm tip 24 have the shape of a circular segment. The relevant arresting arm base body 23 has a constant radius along the central longitudinal axis 9, so that the relevant arresting arm base body 23 is substantially designed in the form of a half-cylinder. Compared to this the radius of the relevant arresting arm tip 24 along the central longitudinal axis 9 narrows towards the free end 30, so that the second arresting section 7 narrows in the direction of the assembly area A. The fact that the relevant arresting arm tip 24 has a larger radius directly next to the associated arresting arm base body 23 means that the arresting arm tip 24 forms a corresponding second arresting projection 25 with the associated arresting arm base body 23. The relevant second arresting projection 25 forms an associated third stop 26 on a front side facing the central section 8. The relevant stop 26 has the form of an annular section.

The spacer element 5 comprises a spacer section 27 and an insertion section 28 formed as a single piece with the same. The spacer section 27 and the insertion section 28 are of a hollow cylindrical design and delimit an arresting recess 29. The arresting recess 29 extends along a central longitudinal axis 9' through the spacer element 5. The spacer element 5 comprises an internal thread 31 on an interior wall facing the arresting recess 29, for arresting the first arresting projections 18. The spacer section 27 has a larger radius than the insertion section 28, so that the spacer element 5 forms an annular insertion stop 32. In addition the spacer section 27 forms an annular stop 33 on a side facing away from the insertion section 28. The spacer element 5 consists of a metal, in particular steel or brass, for soldering the same to the first circuit board 2.

The spaced connecting of the circuit boards 2, 3 is described in detail hereafter. The circuit boards 2, 3 are connected with each other by means of several fitting devices 1 in a spaced way. Only the connecting of the circuit boards 2, 3 by means of one of the fitting devices 1 is described hereafter by way of example.

The fitting device 1 is first produced from the fitting element 4 and the associated spacer element 5. For this the first arresting section 6 is inserted into the arresting recess 29, so that the first arresting projections 18 arrest the internal thread 31. Insertion is facilitated by the support pin tip 15. Insertion is stopped when the stops 11 and 33 abut against each other.

The spacer element 5 is provided as a separate construction component. Several similar spacer elements 5 of different lengths L are preferably provided, so that a spacer element 5 of the desired length L can be selected depending on the desired distance between the circuit boards 2, 3. The arresting of the fitting element 4 with the associated spacer element 5 can be manual or automated. An automated arresting is for example realized in that several fitting elements 4 are bundled and associated spacer elements 5 provided fully automatically. Automated arresting can also for example be realized in that the fitting element 4 is pneumatically held on the flat assembly area A and inserted into the arresting recess 29 by means of a suitable handling system with the first arresting section 6. The spacer element 5 is here for example mechanically held by means of the handling system.

The first circuit board 2 is then fitted to the fitting device 1. For this the fitting device 1 is pneumatically held on the assembly area A and inserted into an associated insertion opening 34 in the first circuit board 2 by means of a handling system of the insertion section 28 of the spacer element 5. Insertion is stopped by the insertion stop 32. The metallic spacer element 5 is then soldered to the first circuit board 2 with a soldering agent 35 according to an SMD construction element (SMD: Surface Mounted Device). Additional SMD construction elements can possibly also be soldered onto the first circuit board 2 with this soldering process. The soldering agent 35 creates a permanent connection between the metallic spacer element 5 and the first circuit board 2. The fact that the fitting element 4 is formed from a high temperature resistant plastic material means that the fitting element 4 is not damaged by the soldering process.

The second circuit board 3 is then connected with the fitting element 4. For this the second circuit board 3 is manually or automatically taken up and moved in the direction of the central longitudinal axis 9 in such a way that the second arresting section 7 is inserted into a continuous recess 36 of the second circuit board 3. During this insertion the arresting arms 19, 20 are displaced radially in the direction of the central longitudinal axis 9, so that the wall 22 is deformed or destroyed due to the formation of the same as a predetermined deformation point or a predetermined breaking point. The arresting arm tips 24 can therefore be guided through the recess 36 in a simple way. The movement of the second circuit plate 3 along the central longitudinal axis 9 is stopped when the second circuit board 3 abuts against the stop 12. The axial length of the arresting arm base body 23 is adapted in such a way that the arresting arm tips 24 are guided through the recess 36 completely upon abutment, so that the third stops 26 form a counter-stop for the second circuit board 3. For this the axial length of the arresting arm base bodies 23 approximately equals the thickness of the second circuit board 3. Once the arresting arm tips 24 have been guided through the recess 36 completely, the elastic arresting arms 19, 20 are once again displaced in the a radial direction away from the central longitudinal axis 9. The radius of the arresting arm base bodies 23 substantially equals the radius of the recess 36, so that the second circuit board 3 abuts diagonally against arresting arm base bodies 23 transverse to the central longitudinal axis 9 and is held safely. The second arresting section 7 is safely fitted to the second circuit board 3 in an axial and radial direction in this way.

If the second circuit board 3 is designed in such a way that the recess 36' expands in the direction of a side facing away from the first circuit board 2, then the second circuit board 3 abuts against the stop 12 and is secured in a radial direction. In an axial direction the second circuit board 3 is held in position by gravity. This alternative design of the second circuit board 3 and the recess 36' is illustrated in FIG. 1 as a broken line.

Figure 5:
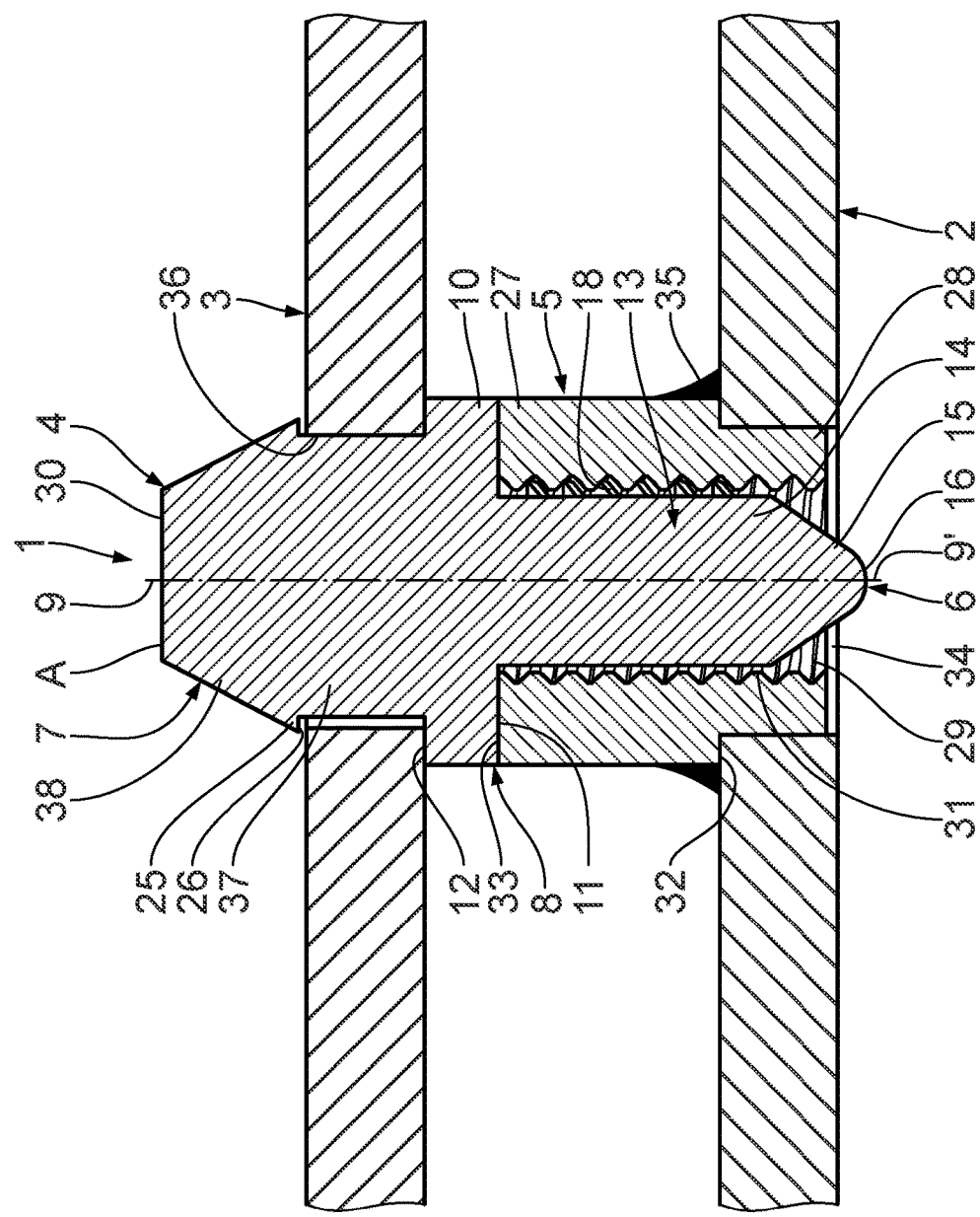
FIG. 5 is a cross-sectional view through a fitting device according to a second embodiment example, connecting two circuit boards with each other in a spaced way.

A second embodiment example will be described hereafter with reference to FIG. 5. Unlike the first embodiment example the second arresting section 7 comprises a cylinder-shaped base body 37 and a tip 38 with a circular cross-section. The end of the tip 38 forms the flat assembly area A. The tip 38 further forms a second arresting projection 25 with a third stop 26. The fitting element 4 is made of an elastic material, in particular of an elastic plastic or rubber material, so that the second arresting section 7 can be inserted through the recess 36. We refer to the first embodiment example with regard to the further construction and further functionality.

Figure 6:
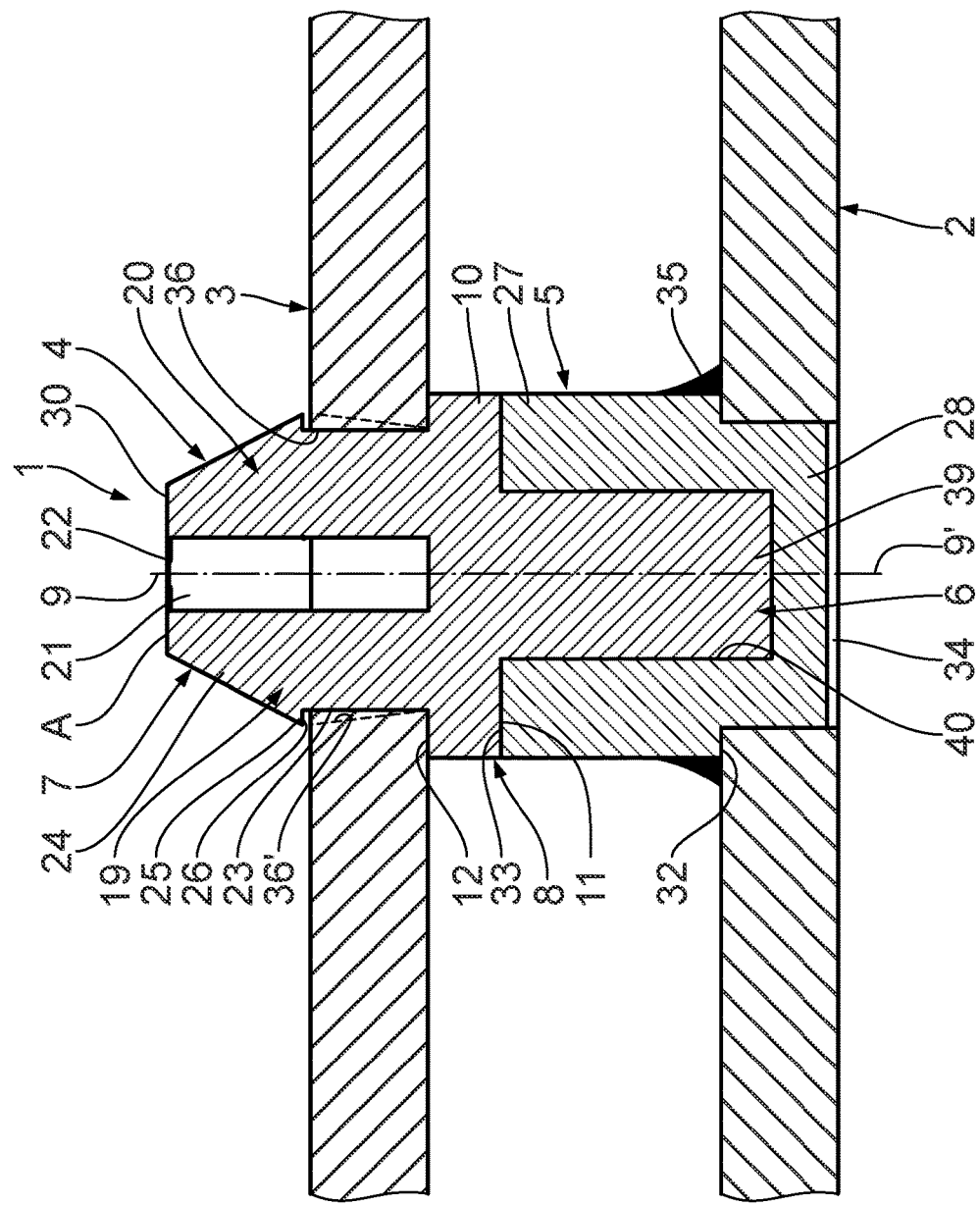
FIG. 6 is a cross-sectional view through a fitting device according to a third embodiment example, connecting two circuit boards with each other in a spaced way.

A third embodiment example will be described hereafter with reference to FIG. 6. Unlike the previous embodiment examples the fitting section 6 is connected with the spacer element 5 in a friction-locking and/or firmly bonded way. For this the fitting section 6 comprises a fitting pin 39, which is connected with the central section 8. The fitting pin 39 is arranged in a recess 40 of the spacer element 5. The fitting pin 39 can narrow at its free end 16 much like the previous embodiment examples. Alternatively the end of the fitting pin 39 can be designed flat. The recess 40 can be designed as a through bore or a dead-end bore. A dead-end design is illustrated in FIG. 6. The fitting pin 39 can be connected with the spacer element 5 by means of a press fit connection, an adhesive connection or an injection molded connection. In the case of an injection molded connection the spacer element 5 serves as an insertion part for an injection molding machine, wherein the fitting element 4 is connected with the spacer element 5 through injection molding directly during production. We refer to the previous embodiment examples with regard to the further construction and further functionality.

The spaced installation of circuit boards 2, 3 according to the invention therefore guarantees high process safety and a high degree of automation during the installation of two circuit boards at a defined distance. The assembly area provides an integrated suction aid and guarantees a fully automatic equipping of the fitting device 1 on the first circuit board 2. The integrated suction aid does not need to be removed later. The assembly area is equipped with a predetermined deformation point or a predetermined breaking point, so that a snap-in function or arresting function of the second arresting section 7 is guaranteed after said equipping. The SMD equipping on the first circuit board 2 and the snap-in connection or arresting connection with the second circuit board 3 makes screwing unnecessary, so that high process safety is guaranteed. Circuit boards 2, 3 can therefore be flexibly and reliably connected with each other easily and quickly in a spaced way by means of the fitting device 1.

While specific embodiments of the invention have been shown and described in detail to illustrate the application of the principles of the invention, it will be understood that the invention may be embodied otherwise without departing from such principles.

The invention claimed is:

1. A fitting element for fitting to a circuit board, the fitting element comprising:
   a first fitting section for connection with a spacer element;
   a second arresting section for arresting with the circuit board; and
   a central section, arranged between the first fitting section and the second arresting section for forming a first stop for the spacer element and a second stop for the circuit board, wherein the second arresting section comprises at least two arresting arms, arranged at a distance from each other and connected by a wall at ends of the at least two arresting arms, the wall forming a predetermined deformation point, wherein the wall forms an assembly area, the first fitting section comprising a closed end outer surface facing in a direction away from the second arresting section and the central section.

2. The fitting element according to claim 1, wherein the assembly area is flat.

3. The fitting element according to claim 1, wherein the second arresting section comprises the predetermined deformation point in a region of the assembly area.

4. The fitting element according to claim 1, wherein the first fitting section comprises a first arresting section comprising a support pin, arranged concentrically to a central longitudinal axis, on which at least one first arresting projection is formed.

5. The fitting element according to claim 4, wherein several first arresting projections are formed on the support pin along the central longitudinal axis.

6. The fitting element according to claim 1, wherein the first fitting section narrows towards a free end.

7. The fitting element according to claim 1, wherein the second arresting section comprises at least one second arresting projection and narrows in a direction of a free end, starting from the at least one second arresting projection.

8. The fitting element according to claim 1, wherein the first fitting section, the second arresting section and the central section are made from a plastic material that is resistant up to a temperature of at least 240° C.

9. The fitting element according to claim 1, wherein the first fitting section, the second arresting section and the central section are made from an electrically insulating plastic material.

10. The fitting element according to claim 1, wherein the first fitting section, the second arresting section and the central section are formed as a single piece.

11. The fitting element according to claim 1, wherein the assembly area extends vertically to a central longitudinal axis of the fitting element.

12. The fitting element according to claim 1, wherein the predetermined deformation point is a predetermined breaking point.

13. The fitting element according to claim 1, wherein the wall comprises a planar structure bridging a space defined between the at least two arresting arms.

14. The fitting element according to claim 13, wherein one of the at least two arresting arms is in direct contact with one area of the wall and another one of the at least two arresting arms is in direct contact with another area of the wall, the one area of the wall being located at a spaced location from the another area of the wall.

15. The fitting element according to claim 1, wherein the first fitting section comprises a peripheral outer surface located at one end of the first fitting section, wherein another end of the first fitting section is located adjacent to the central section, the peripheral outer surface extending continuously, without interruption, from one side of the first fitting section and another side of the first fitting section.

16. A fitting element for fitting to a circuit board, the fitting element comprising:
   a first fitting section for connection with a spacer element;
   a second arresting section for arresting with the circuit board; and
   a central section, arranged between the first fitting section and the second arresting section for forming a first stop for the spacer element and a second stop for the circuit board, wherein the second arresting section comprises at least two arresting arms, arranged at a distance from each other and connected by a wall at ends of the at least two arresting arms, the wall forming a predetermined deformation point, wherein the wall forms an assembly area, the first fitting section comprising a first arresting section comprising a support pin, arranged concentrically to a central longitudinal axis, on which at least one first arresting projection is formed, wherein several first arresting projections are formed on the support pin along the central longitudinal axis.

17. A fitting element for fitting to a circuit board, the fitting element comprising:
   a first fitting section for connection with a spacer element;
   a second arresting section for arresting with the circuit board; and
   a central section, arranged between the first fitting section and the second arresting section for forming a first stop for the spacer element and a second stop for the circuit board, wherein the second arresting section comprises at least two arresting arms, arranged at a distance from each other and connected by a wall at ends of the at least two arresting arms, the wall forming a predetermined deformation point, wherein the wall forms an assembly area, the first fitting section comprising a peripheral outer surface located at one end of the first fitting section, wherein another end of the first fitting section is located adjacent to the central section, the peripheral outer surface extending continuously, without interruption, from one side of the first fitting section and another side of the first fitting section.

* * * * *